United States Patent
Kaya et al.

(10) Patent No.: US 6,306,690 B1
(45) Date of Patent: Oct. 23, 2001

(54) PROCESS FLOW TO INTEGRATE HIGH AND LOW VOLTAGE PERIPHERAL TRANSISTORS WITH A FLOATING GATE ARRAY

(75) Inventors: Cetin Kaya, Dallas; Stanton P. Ashburn, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/389,144

(22) Filed: Sep. 2, 1999

Related U.S. Application Data

(62) Division of application No. 09/182,370, filed on Oct. 29, 1998.
(60) Provisional application No. 60/064,282, filed on Oct. 30, 1997.

(51) Int. Cl.$^7$ .................................. H01L 21/332
(52) U.S. Cl. ................. 438/136; 438/135; 438/139; 438/140; 438/258; 257/168
(58) Field of Search ................. 438/135, 136, 438/139, 140, 133, 258; 257/107, 168; 361/100, 205

(56) References Cited

U.S. PATENT DOCUMENTS

| | | | |
|---|---|---|---|
| 4,471,373 | | 9/1984 | Shimizu et al. ............... 357/41 |
| 5,104,819 | * | 4/1992 | Freiberger et al. ........... 437/43 |
| 5,188,976 | | 2/1993 | Kume et al. ................. 435/52 |
| 5,409,854 | * | 4/1995 | Bergemont ................... 437/43 |
| 5,472,892 | * | 12/1995 | Gwen et al. ................. 437/43 |
| 5,514,889 | * | 5/1996 | Cho et al. .................. 257/316 |
| 5,856,221 | * | 1/1999 | Clementi et al. ............. 438/258 |
| 5,861,347 | * | 1/1999 | Maiti et al. ................ 438/787 |
| 5,888,869 | * | 3/1999 | Cho et al. .................. 438/258 |
| 6,121,116 | * | 9/2000 | Sung ........................ 438/452 |
| 6,133,093 | * | 10/2000 | Prinz et al. ................. 438/257 |
| 6,159,799 | * | 12/2000 | Yu .......................... 438/257 |
| 6,165,846 | * | 12/2000 | Carns et al. ................ 438/264 |

FOREIGN PATENT DOCUMENTS

| | | | |
|---|---|---|---|
| 0 379 449 A1 | 1/1990 | (EP) | .............. H01L/21/82 |
| 0751 560 A1 | 6/1995 | (EP) | ............ H01L/21/8247 |
| 0 7 28332 A | 10/1995 | (JP) | ............ H01L/21/8238 |
| 08 306889 A | 11/1996 | (JP) | ............ H01L/27/10 |

\* cited by examiner

*Primary Examiner*—Wael Fahmy
*Assistant Examiner*—Fernando Toledo
(74) *Attorney, Agent, or Firm*—Jacqueline J. Garner; W. James Brady III; Frederick J. Telecky, Jr.

(57) ABSTRACT

The invention comprises an integrated circuit including integral high and low-voltage peripheral transistors and a method for making the integrated circuit. In one aspect of the invention, a method of integrating high and low voltage transistors into a floating gate memory array comprises the steps of forming a tunnel oxide layer outwardly from a semiconductor substrate, forming a floating gate layer disposed outwardly from the tunnel oxide layer and forming an insulator layer disposed outwardly from the floating gate layer to create a first intermediate structure. The method further includes the steps of masking a first region and a second region of the first intermediate structure leaving a third region unmasked, removing at least a portion of the insulator layer, the floating gate layer and the tunnel oxide layer from the third region and forming a first dielectric layer disposed outwardly from the substrate in a region approximately coextensive with the third region. The second region and the third region are masked, leaving the first region unmasked. Then, at least a portion of the insulator layer, the floating gate layer and the tunnel oxide layer is removed from the first region. A second dielectric layer is formed outwardly from the substrate and the first dielectric layer in a region approximately coextensive with the first region and the third regions, respectively.

10 Claims, 3 Drawing Sheets

PROCESS FLOW TO INTEGRATE HIGH AND LOW VOLTAGE PERIPHERAL TRANSISTORS WITH A FLOATING GATE ARRAY

CROSS REFERENCE TO PRIOR APPLICATIONS

This application is a division of application Ser. No. 09/182,370 filed Oct. 29, 1998, and claiming priority based upon Provisional Application No. 60/064,282 filed Oct. 30, 1997.

TECHNICAL FIELD OF THE INVENTION

This invention relates generally to electronic devices, and more particularly, to a method and apparatus for integrating high and low voltage transistors with a floating gate array.

BACKGROUND OF THE INVENTION

One type of modern nonvolatile memory is the EPROM or EEPROM device that uses floating gate structures. These floating gate memory structures may be integrated into a floating gate array which facilitates interface between the memory cells and control circuitry. The memory cells use channel hot electrons for programming from the drain side and use Fowler-Nordheim tunneling for erasure from the source side. Due to the high voltages frequently used to program and erase the cells, high-voltage peripheral transistors may be implemented to provide an interface between a high-voltage source and the memory cells of the floating gate array. The control logic circuitry of the floating gate array typically functions with a lower operating voltage. Low-voltage peripheral transistors may be implemented to provide the logic circuitry for the array.

To minimize the size of the device, it is desirable to fabricate the peripheral transistors and the floating gate memory cells on a common semiconductor substrate. One approach to manufacturing floating gate arrays with integral peripheral transistors is to form an integrated circuit having a memory cell region, a low-voltage region and a high voltage region. To achieve a desired device scale, the integrated circuit may be formed using shallow trench isolation. Oxide layers to support high and low-voltage transistors are then grown on the substrate surface using the following steps: (1) after deglazing the substrate surface, tunnel oxide, polysilicon and insulator layers are formed on the deglazed substrate surface; (2) the insulator and polysilicon layers are etched from the high and low-voltage regions of the substrate and the tunnel oxide layer is wet deglazed to expose the substrate surface; (3) a high-voltage oxide layer is grown over the high and low-voltage regions of the substrate; (4) the high-voltage oxide layer is wet deglazed from the low-voltage region of the substrate to expose the substrate's surface; and (5) a low-voltage oxide layer is grown in the low-voltage region of the substrate. This process uses three deglazing steps and two oxidation steps.

A problem with this method is that when it is used in conjunction with shallow trench isolation, each deglazing step results in a deeper recession in the oxide within the trenches of the substrate. The deeper this recession becomes, the greater the exposure of the corners of the trenches within the substrate. Requiring three deglazing steps substantially exposes the trench corners, degrading the performance and reliability of the device. For example, exposed trench corners may lead to levels of leakage current which limit the minimum allowable gate length of the device. Leakage current results because the threshold voltage of the device at an exposed corner is lower than the normal threshold voltage of the device. Where the off-voltage of the device is set above the reduced threshold voltage of a trench corner, substantial leakage current results. This phenomenon is commonly referred to as a subthreshold kink in the I/V characteristic of the device. Exposing the trench corners may also degrade the device's gate oxide integrity resulting in a reduction of the gate oxide's charge to breakdown.

Another problem with this method is that it subjects the oxide in the substrate trenches to two oxidations. Each time the substrate is exposed to an oxidizing ambient, oxygen diffuses into the sidewalls of the trench and reacts with the silicon in the sidewalls. As the oxygen and silicon react, oxide is formed which grows away from the trench wall. Because the trenches are already filled with oxide, the existing oxide and the newly-formed oxide compete for the limited space within the trench, causing stress on the oxide within the trench and in the substrate surrounding the silicon trenches. At some point, the stress within the oxide and surrounding silicon causes dislocations in the silicon substrate, which, in turn, increases leakage current. Increasing the number of oxidations, then, ultimately increases the leakage current of the device.

The stress induced in the silicon and the corresponding increase in leakage current becomes more of a problem for silicon that is surrounded by trenches with trench widths less than approximately 3 microns. This is due to the reduced area in the trench, within which additional oxide is growing during the oxidations. The less room there is in the trench for expansion, the higher the stress in the surrounding silicon.

SUMMARY OF THE INVENTION

In accordance with the teachings of the present invention, a floating gate memory array integrated with peripheral circuitry is provided that substantially eliminates or reduces the disadvantages associated with prior techniques and processes.

In accordance with one embodiment of the present invention, a method of integrating high and low voltage transistors into a floating gate memory array comprises the steps of forming a tunnel oxide layer outwardly from a semiconductor substrate, forming a floating gate layer disposed outwardly from the tunnel oxide layer and forming an insulator layer disposed outwardly from the floating gate layer to create a first intermediate structure. The method further includes the steps of masking a first region and a second region of the first intermediate structure leaving a third region unmasked, removing at least a portion of the insulator layer, the floating gate layer and the tunnel oxide layer from the third region and forming a first dielectric layer disposed outwardly from the substrate in a region approximately coextensive with the third region. The second region and the third region are masked, leaving the first region unmasked. Then, at least a portion of the insulator layer, the floating gate layer and the tunnel oxide layer is removed from the first region. A second dielectric layer is formed outwardly from the substrate and the first dielectric layer in a region approximately coextensive with the first region and the third regions, respectively.

The present invention has several important technical advantages. The invention involves only two deglazing steps, which decreases the total deglazing time by approximately sixty percent when compared to typical methods of integrating peripheral transistors. Reducing the number of deglazes also reduces trench corner exposure, which decreases leakage current associated with subthreshold kinking and maintains gate oxide integrity. Additionally, the invention reduces the number of oxidations of the low-voltage region to one oxidation. Reducing the number of oxidations minimizes oxide stress within the substrate trenches, substantially eliminating leakage current within the device. Moreover, the invention does not add complexity to the integrated circuit manufacturing process. For example, the additional etch necessary to remove the tunnel oxide, floating gate and insulator layers from the low-voltage region is a non-critical etch. Furthermore, the periphery pattern used to mask the low-voltage region during the additional etch does not require formation of layers beyond what would otherwise be necessary to integrate the periphery transistors.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
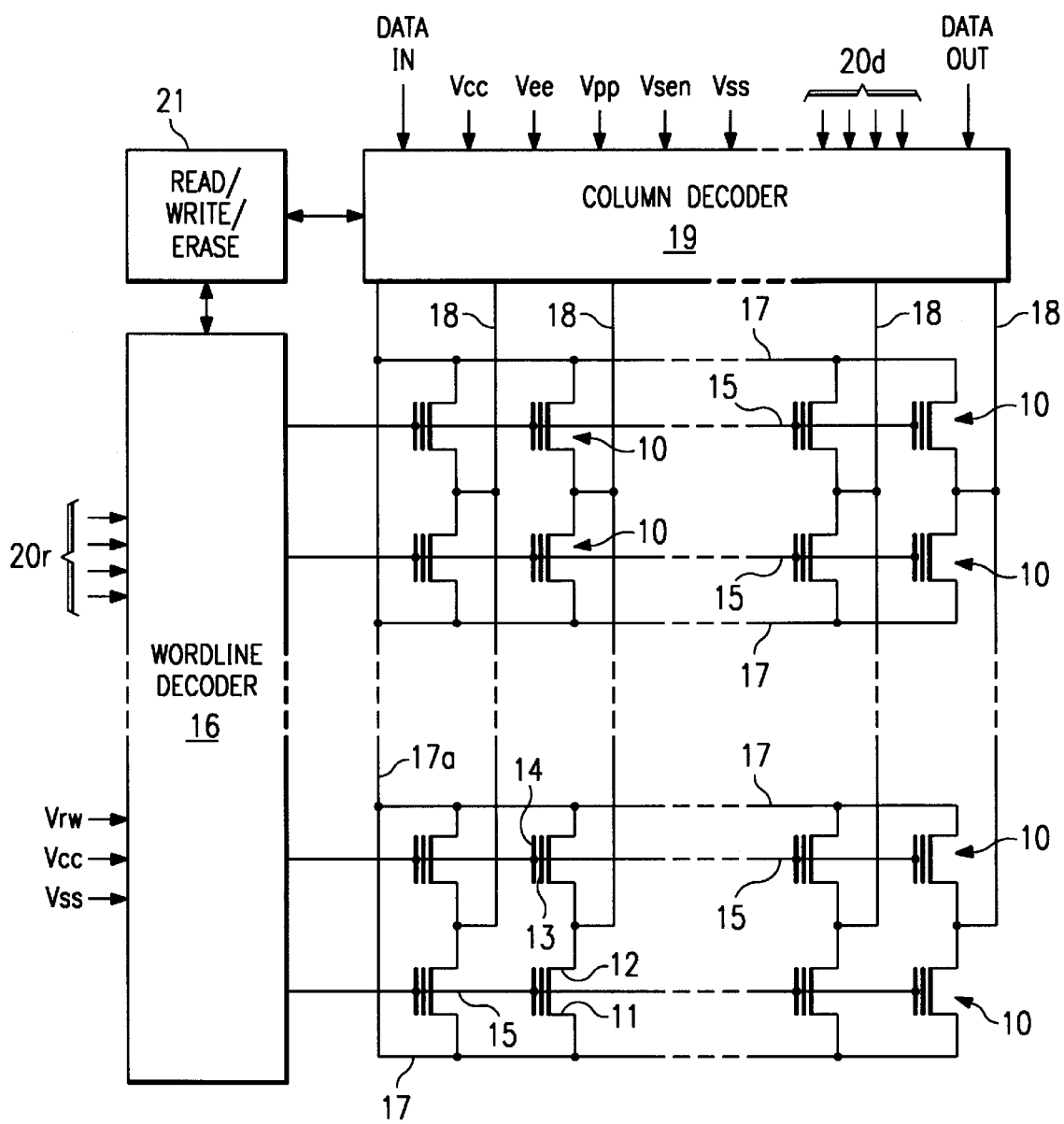
FIG. 1 is an electrical schematic diagram, in partial block form, of a floating gate memory.

Referring now to FIG. 1, an example of a memory circuit including memory cells which are an integral part of a memory chip or memory structure in an application specific integrated circuit, is shown for the purpose of illustrating a possible use of this invention. Each cell is a floating-gate transistor 10 having a source 11, a drain 12, a floating gate 13 and a control gate 14.

Each of the control gates 14 in a row of cells 10 is connected to a wordline 15, and each of the word lines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a column line 17a to a column decoder 19, and each of the drain-column lines 18 is connected to the column decoder 19. Wordline decoder 16 and column decoder 19 may include periphery transistors for interfacing various voltage sources with memory cells and control circuitry.

In a write or program mode, the wordline decoder 16 may receive signals from a Read/Write/Erase control circuit 21 (or microprocessor 21), as well as wordline address signals from lines 20r. Wordline decoder 16 may respond by placing a preselected first programming voltage $V_{RW}$ (approx. +12V) on a selected wordline 15, including a selected control-gate conductor 14. Column decoder 19 also functions to place a second programming voltage $V_{PP}$ (approx. +5 to +10V) on a selected drain-column line 18 and, therefore, the drain 12 of selected cell 10. Source lines 17 are connected to reference potential $V_{SS}$. All of the deselected drain-column lines 18 are connected to reference potential $V_{SS}$. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10.

The programming time is selected to be sufficiently long to program the floating gate 13 with a negative program charge of approximately −2V to −6V with respect to the channel region. For memory cells 10 fabricated in accordance with the preferred embodiment, the coupling coefficient between a control gate 14/wordline 15 and a floating gate 13 is approximately 0.6. Therefore, a programming voltage $V_{RW}$ of 12 volts, for example, on a selected wordline 15, including the selected gate control 14, places a voltage of approximately +6 to +7V on the selected floating gate 13. The floating gate 13 of the selected cell 10 is charged with channel-hot electrons during programming. The electrons, in turn, render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the word lines 15 to reference potential $V_{SS}$. The column decoder 19 also functions to apply a high positive voltage $V_{EE}$ of approximately +5 to +15 volts to all the source lines 17, with a gate bias voltage of zero volts. In another embodiment, the column decoder may function to apply a high positive voltage $V_{EE}$ of approximately +3 to +7 volts to all the source lines 17, with a gate bias voltage of −6 to −11 volts. These erasing voltages create sufficient field strength across the tunneling area between gate 13 and the substrate to generate a Fowler-Nordheim tunnel current that transfers charge from the floating gate 13, erasing the memory cell 10.

In the read mode, the wordline decoder 16 functions, in response to wordline address signals on line 20r and to signals from Read/Write/Erase control circuit 21, to apply a preselected positive voltage $V_{cc}$ (approx. +5V) to the selected wordline 15, and to apply a low voltage (ground or $V_{SS}$) to deselected word lines 15. The column decoder 19 functions to apply a preselected positive voltage $V_{SEN}$ (approx. +1.0V) to at least the selected drain column line 18 and to apply a low voltage (0V) to the source line 17. The column decoder 19 also functions, in response to a signal on address lines 20d, to connect the selected drain-column line 18 of the selected cell 10 to the DATA OUT terminal. The conductive or non-conductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10, but are insufficient to create either hot-carrier injection or Fowler-Nordheim tunneling that would disturb the charge condition of any floating gate 13.

For convenience, a table of read, write and erase voltages is given in TABLE 1 below:

TABLE 1

|  | Read | Write | Flash Erase |
| --- | --- | --- | --- |
| Selected Wordline | 5 V | 12 V | 0 V (All) or −6 to −11 V (All) |

TABLE 1-continued

| | Read | Write | Flash Erase |
|---|---|---|---|
| Deselected Word lines | 0 V | 0 V | — |
| Selected Drain Line | 1.0 V | 5–10 V | Float (All) |
| Deselected Drain Lines | Float | 0 V | — |
| Source Lines | 0 V | About 0 V | 5–15 V (All) or 3 to 7V (All) |

Note that voltage levels may vary depending on the technology node and methods used for erase (e.g. source erase, channel erase, etc.).

Figure 2:
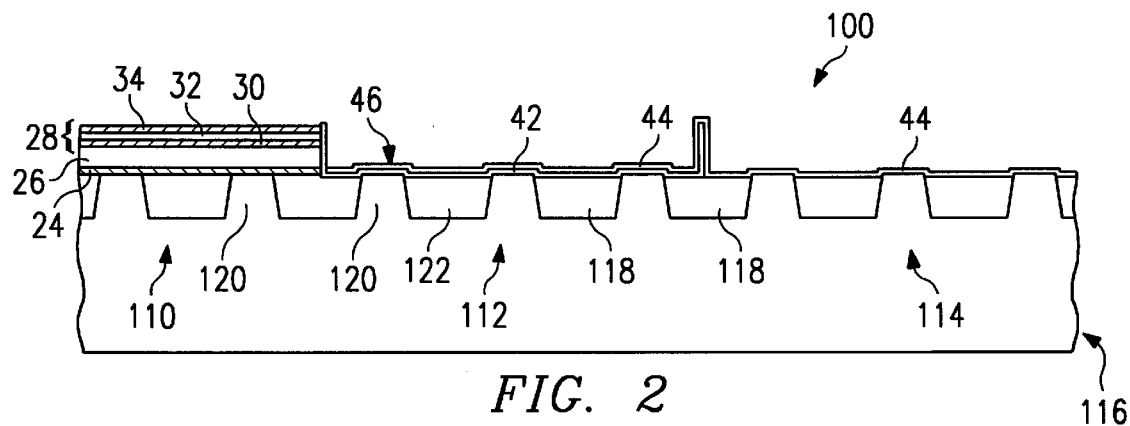
FIG. 2 shows a cross section of a portion of an integrated circuit constructed according to the teachings of the present invention.

FIG. 2 shows a cross section of an exemplary integrated circuit 100 constructed according to the teachings of the present invention. Integrated circuit 100 may comprise a memory cell region 110, a high-10 voltage region 112 and a low-voltage region 114. These regions may have any orientation with respect to one another and could be interspersed if necessary.

Integrated circuit 100 may include a semiconductor substrate 116 comprising a plurality of trenches 118 and a plurality of moats 120 disposed adjacent to the plurality of trenches 118. A substrate oxide layer 122 may be disposed in trenches 118 of semiconductor substrate 116. In this embodiment, semiconductor substrate 116 comprises a wafer.

Memory cell region 110 may include a tunnel oxide layer 24 formed outwardly from semiconductor substrate 116. Tunnel oxide layer 24 may comprise, for example, 95 Å of oxide. Another dielectric material other than oxide could be used for this layer. Memory cell region 110 may further comprise a floating gate layer 26 formed outwardly from tunnel oxide layer 24. Floating gate layer 26 may comprise, for example, 1500 Å of polysilicon. Floating gates of the memory cells of integrated circuit 100 may later be formed from floating gate layer 26. Using polysilicon to form floating gate layer 26 is only one example and other materials could be used to form the floating gates. Similarly, the thickness of the various layers indicated throughout this document are provided by way of example and other thicknesses could be used.

An insulator layer 28 may be formed outwardly from floating gate layer 26. Insulator layer 28 may comprise an oxide-nitride oxide (ONO) structure, or could be formed from other dielectric materials. In the case of oxide-nitride-oxide, insulator layer 28 includes a first oxide insulator layer 30 disposed outwardly from floating gate layer 26, a nitride layer 32 disposed outwardly from first oxide insulator layer 30 and a second oxide insulator layer 34 disposed outwardly from nitride layer 32. First and second oxide insulator layers 30 and 34 may each comprise, for example, 60 Å of oxide. Nitride layer 32 of insulator layer 28 may comprise, for example, 60 Å of nitride. Oxide layer 24, floating gate layer 26 and insulator layer 28 may be used in conjunction with trenches 118 and moats 120, to form floating gate memory cells in memory cell region 110 of integrated circuit 100.

High-voltage region 112 of integrated circuit 100 includes a high-voltage dielectric layer 46. High-voltage dielectric layer 46 may comprise, for example, 180Å of oxide. Again, dielectric materials other than oxide may be used. High-voltage dielectric layer 46 may serve as a tunnel oxide layer for subsequently formed high-voltage peripheral transistors in integrated circuit 100. The high-voltage peripheral transistors may provide, for example, an interface coupling a high-voltage power source to the memory cells of memory cell region 110, which may require high voltage during programming and erasing. Throughout this document, the terms "couple," "coupled" and "coupling" are used to mean either a direct or indirect connections between elements. One or more elements may, but need not, exist between two elements said to be "coupled" to each other. The high-voltage peripheral transistors may comprise, for example, complementary metal-oxide-semiconductor (CMOS) transistors.

Low-voltage region 114 of integrated circuit 100 includes a low-voltage dielectric layer 44. Low-voltage dielectric layer 44 may comprise, for example, 60 Å of oxide, and could also comprise a different dielectric material. Low-voltage dielectric layer 44 may serve as a oxide layer for subsequently formed low-voltage peripheral transistors in integrated circuit 100. The low-voltage peripheral transistors may, for example, couple logic circuitry (not explicitly shown) to a lower operating voltage. Again, the term "couple" does not necessarily imply a direct connection between the elements said to be "coupled." The low-voltage peripheral transistors may comprise, for example, CMOS transistors.

Figure 3A:
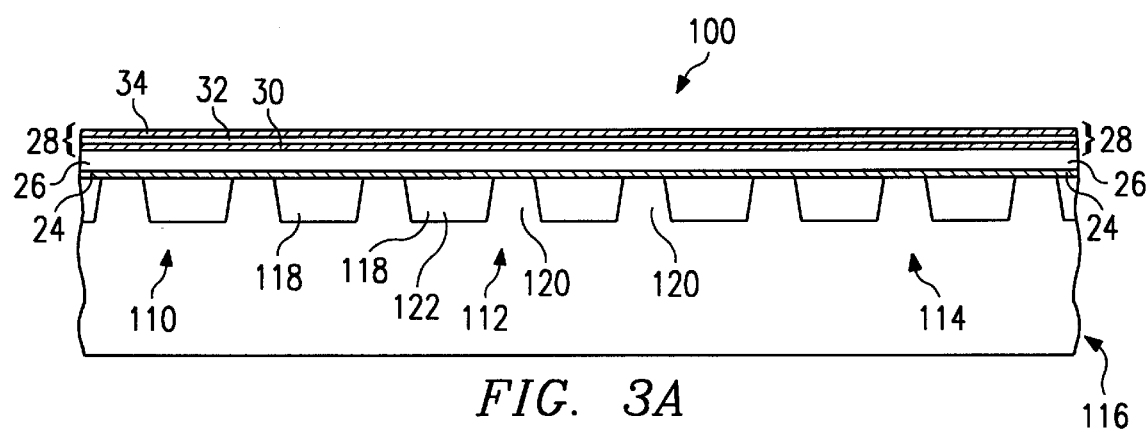
FIGS. 3a–3e show an exemplary series of steps in the formation of an integrated circuit according to the teachings of the present invention.
Figure 3B:
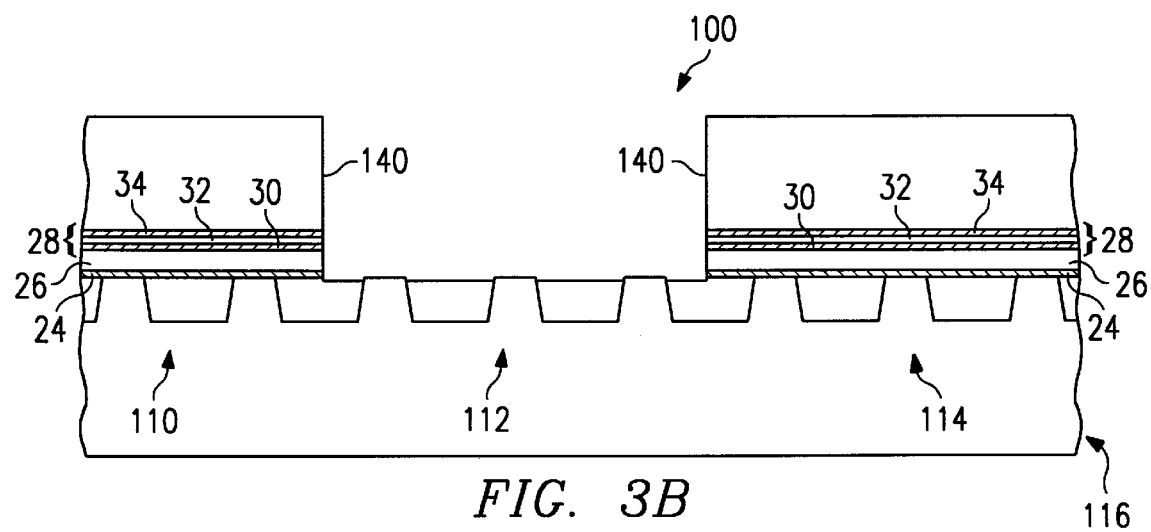
Figure 3C:
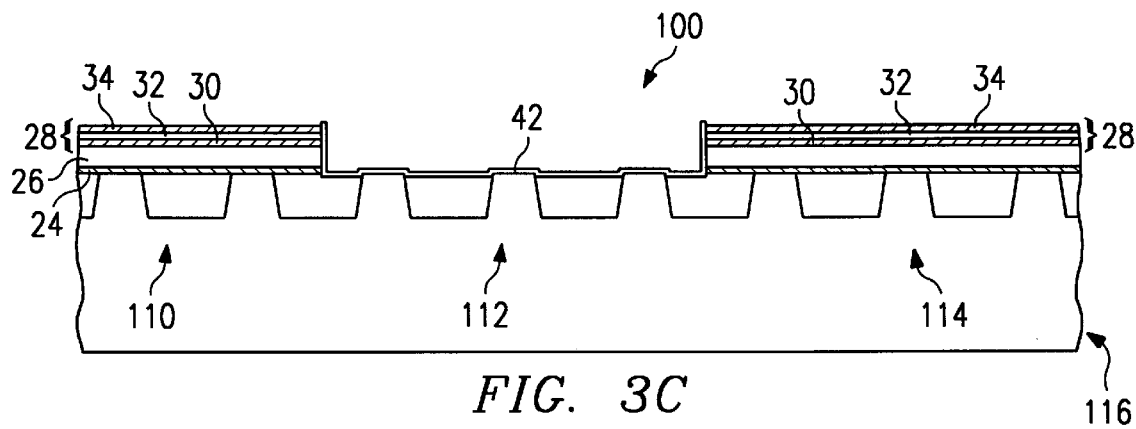

FIG. 3c shows integrated circuit 100 after high-voltage periphery pattern 140 has been removed, and a first dielectric layer 42 has been formed outwardly from high-voltage region 112 of substrate 116. Nitride layer 32 acts as a barrier to floating gate layer 26, ensuring that it remains undisturbed during oxidation of first dielectric layer 42. First dielectric layer 42 comprises at least a portion of the total high voltage oxide layer 46 for high-voltage periphery transistors to be formed in high-voltage region 112. First dielectric layer 42 may comprise, for example, 150 Å of oxide. This layer could alternatively comprise a dielectric material other than oxide.

FIGS. 3a–3e show an exemplary series of steps in the formation of integrated circuit 100 according to the teachings of the present invention. These Figures illustrate cross-sectional views of portions of integrated circuit 100.

FIG. 3a shows an exemplary integrated circuit 100 having a memory cell region 110, a high-voltage region 112 and a low-voltage region 114 constructed according to the teachings of the present invention. The process begins with the formation of a tunnel oxide layer 24 outwardly from semiconductor substrate 116. As described above, substrate 116 comprises a plurality of trenches. 118 having substrate oxide layer 122 disposed therein and a plurality of moats 120 formed adjacent to the plurality of trenches 118. Trenches 118 may be formed, for example, using shallow trench isolation. Other methods of forming trenches 118 may be used without departing from the scope of the invention. A floating gate layer 26 may be formed outwardly from tunnel oxide layer 24. An insulator layer 28 may be formed outwardly from floating gate layer 26. Portions of tunnel oxide layer 24, floating gate layer 26 and insulator layer 28 may be used to form memory cells in memory cell region 110 of integrated circuit 100.

FIG. 3b shows integrated circuit 100 subsequent to removal of tunnel oxide layer 24, floating gate layer 26 and insulator layer 28 from high-voltage region 112. To ensure that areas of these layers in memory cell region 110 and low-voltage region 114 remain intact during the removal of these layers from high-voltage region 112, a high-voltage periphery pattern 140 is formed outwardly from insulator layer 28. High-voltage periphery pattern 140 covers memory cell region 110 and low-voltage region 114, while leaving high-voltage region 112 exposed. High-voltage periphery pattern 140 may comprise, for example, a layer of photoresist. Upon formation of high-voltage periphery pattern 140, insulator layer 28 and floating gate layer 26 are removed from high-voltage region 112, for example, by etching the areas of these layers left exposed by high-voltage periphery pattern 140. Tunnel oxide layer 24 is also removed from high-voltage region 112, for example, by wet deglazing the area of tunnel oxide layer 24 left exposed by high-voltage periphery pattern 140. The resulting structure including high-voltage periphery pattern 140 is illustrated in FIG. 3b.

Figure 3D:
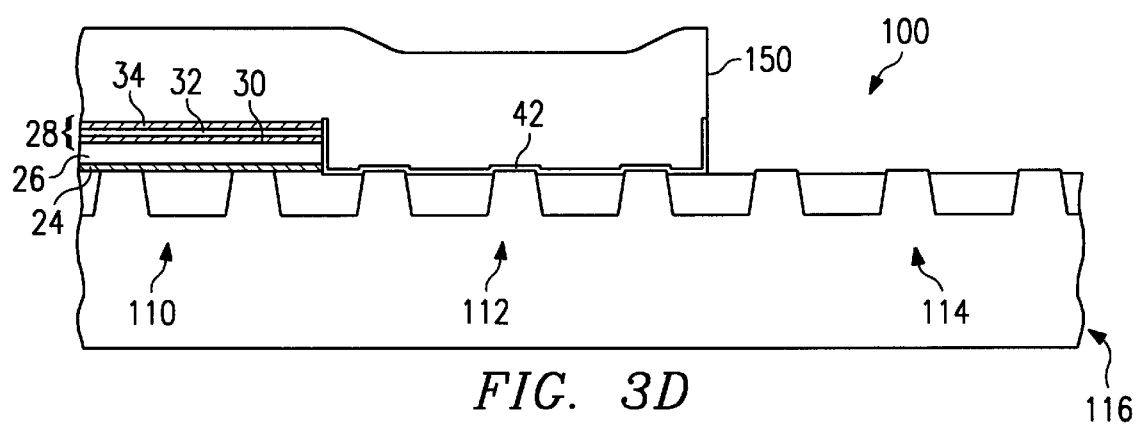

FIG. 3d shows integrated circuit 100 subsequent to the removal of tunnel oxide layer 24, floating gate layer 26 and insulator layer 28 from low-voltage region 114. Prior to removal of these layers, a low-voltage periphery pattern 150 is disposed outwardly from insulator layer 28. Low-voltage periphery pattern 150 covers memory cell region 110 and high-voltage region 112, while leaving low-voltage region 114 exposed. Low-voltage periphery pattern 150 may comprise, for example, a layer of photoresist. Low-voltage periphery pattern 150 ensures that areas of tunnel oxide layer 24, floating gate layer 26 and insulator layer 28 in memory cell region 110, and first dielectric layer 42 in high-voltage region 112 remain intact during the removal of these layers from low-voltage region 114. Insulator layer 28 and floating gate layer 26 are removed from low-voltage region 114, for example, by etching the areas of these layers left exposed by low-voltage periphery pattern 150. Tunnel oxide layer 24 is removed from low-voltage region 114, for example, by wet deglazing the area of layer 24 left exposed by low-voltage periphery pattern 150. The resulting structure including low-voltage periphery pattern 150 is illustrated in FIG. 3d.

Figure 3E:
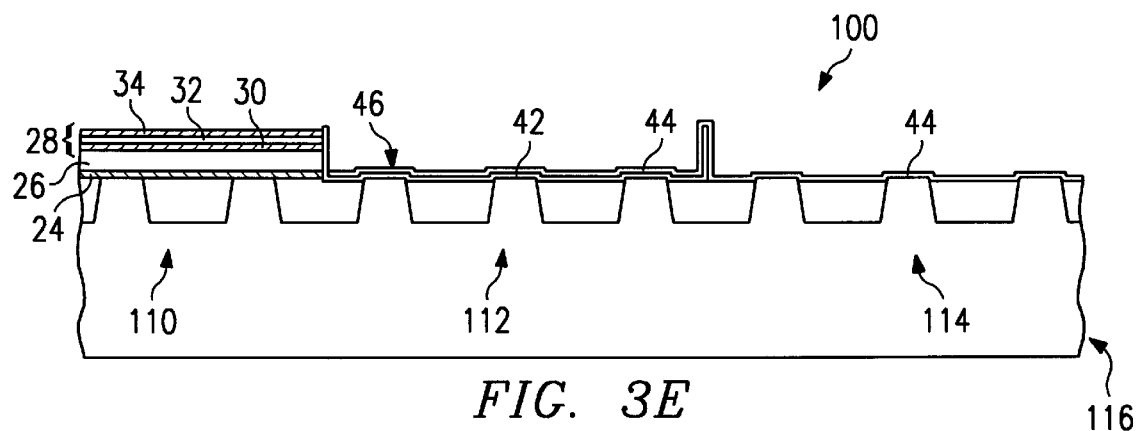

FIG. 3e shows integrated circuit 100 after low-voltage periphery pattern 150 has been removed and a second dielectric layer 44 has been formed outwardly from low-voltage region 114 of substrate 116. Nitride layer 32 acts as a barrier to floating gate layer 26, ensuring that it remains undisturbed during oxidation of second dielectric layer 44. Second dielectric layer 44 may comprise, for example, 60 Å of oxide. Second dielectric layer 44 may also comprise another dielectric material. Second dielectric layer 44 within low-voltage region 114 comprises a low-voltage dielectric layer suitable to support the formation of low-voltage periphery transistors. First dielectric layer 42 and second dielectric layer 44 within high-voltage region 112 comprise a high-voltage dielectric layer 46 suitable to support formation of high-voltage peripheral transistors. High-voltage dielectric layer 46 may comprise, for example, 180 Å of oxide or other suitable dielectric material.

Following these steps, the control gate of the memory cells and gate electrodes of the high and low voltage peripheral transistors are fabricated. A conductive layer is formed on the structure of FIG. 3e and a pattern and etch is performed to form the gate stacks of the memory cells and gate electrodes of the high-voltage and low-voltage transistors.

Although the present invention has been described in detail, it should be understood that various changes, substitutions, and alterations can be made hereto without departing from the spirit and scope of the invention as defined by the appended claims.

What is claimed is:

1. A method of integrating high and low voltage transistors with a floating gate memory array comprising the steps of:

forming a tunnel oxide layer outwardly from a semiconductor substrate;

forming a floating gate layer disposed outwardly from the tunnel oxide layer;

forming an insulator layer disposed outwardly from the floating gate layer to create a first intermediate structure;

masking a first region and a second region of the first intermediate structure leaving a third region unmasked;

removing at least a portion of the insulator layer, the floating gate layer and the tunnel oxide layer from the third region;

forming a first dielectric layer disposed outwardly from the substrate in a region approximately coextensive with the third region;

masking the second region and the third region, leaving the first region unmasked;

removing at least a portion of the insulator layer, the floating gate layer and the tunnel oxide layer from the first region;

forming a second dielectric layer disposed outwardly from the substrate and the first dielectric layer in a region approximately coextensive with the first region and the third regions, respectively.

2. The method of claim 1, wherein the first region comprises a low-voltage region, wherein the second region comprises a memory cell region, and wherein the third region comprises a high-voltage region.

3. The method of claim 1, wherein the step of masking the first region and the second region comprises the step of forming a high-voltage periphery pattern disposed outwardly from the insulator layer.

4. The method of claim 1, wherein the step of masking the second region and the third region comprises the step of forming a low-voltage periphery pattern disposed outwardly from the insulator layer.

5. The method of claim 1, wherein the step of removing at least a portion of areas of the insulator layer, the floating gate layer and the tunnel oxide layer from the third region comprises the steps of:

dry etching the insulator layer and floating gate layer from the third region; and wet deglazing at least a portion of the tunnel oxide layer from the third region.

6. The method of claim 1, wherein the step of removing at least a portion of the insulator layer, the floating gate layer and the tunnel oxide layer from the third region comprises the steps of:

dry etching the insulator layer and floating gate layer from the third region; and wet deglazing approximately 95 Å of the tunnel oxide layer from the third region.

7. The method of claim 1, wherein the step of forming an insulator layer comprises the steps of:

forming a first insulator oxide layer disposed outwardly from the floating gate layer;

forming a nitride layer disposed outwardly from the first insulator layer; and forming a second insulator oxide layer disposed outwardly from the nitride layer.

8. The method of claim 1, wherein the step of forming an insulator layer comprises the steps of:

forming a first insulator oxide layer substantially comprising 60 Å of oxide disposed outwardly from the floating gate layer;

forming a nitride layer Substantially comprising approximately 60 Å of nitride disposed outwardly from the first insulator layer; and forming a second insulator oxide layer substantially comprising approximately 60 Å of oxide disposed outwardly from the nitride layer.

9. The method of claim 1, wherein:

the step of forming the floating gate layer comprises the step of forming approximately 150 Å of polysilicon;

the step of forming the first dielectric layer comprises the step of forming approximately 150 Å of oxide; and the step of forming the second dielectric layer comprises the step of forming approximately 60 Å of oxide.

10. The method of claim 1, wherein the step of forming an insulator layer comprises the steps of:

forming a first insulator oxide layer substantially comprising 60 Å of oxide disposed outwardly from the floating gate layer;

forming a nitride layer substantially comprising approximately 60 Å of nitride disposed outwardly from the first insulator layer; and forming a second insulator oxide layer substantially comprising approximately 60 Å of oxide disposed outwardly from the nitride layer;

the step of forming the floating gate layer comprises the step of forming approximately 150 Å of floating gate;

the step of forming the first dielectric layer comprises the step of forming approximately 150 Å of oxide; and the step of forming the second dielectric layer comprises the step of forming approximately 60 Å of oxide.

* * * * *